(12) United States Patent
Draxelmayr

(10) Patent No.: US 7,804,343 B2
(45) Date of Patent: Sep. 28, 2010

(54) DISTURBANCE SUPPRESSION CAPABLE CHARGE PUMP

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/055,375

(22) Filed: Mar. 26, 2008

(65) Prior Publication Data

US 2009/0243671 A1    Oct. 1, 2009

(51) Int. Cl.
*H03L 7/06* (2006.01)
(52) U.S. Cl. .................................... 327/157; 327/536
(58) Field of Classification Search ................. None
See application file for complete search history.

(56) References Cited

U.S. PATENT DOCUMENTS

| | | | | |
|---|---|---|---|---|
| 6,118,346 A | * | 9/2000 | Olgaard | 331/17 |
| 6,727,735 B2 | * | 4/2004 | Park | 327/157 |
| 6,859,091 B1 | * | 2/2005 | Nicholson et al. | 327/536 |
| 6,897,709 B2 | * | 5/2005 | Henry | 327/536 |
| 6,897,733 B2 | | 5/2005 | Wakayama | |
| 7,075,348 B2 | * | 7/2006 | Hsu et al. | 327/157 |
| 7,081,781 B2 | * | 7/2006 | Zhu et al. | 327/157 |
| 7,184,510 B2 | * | 2/2007 | Jung | 375/374 |
| 7,514,972 B2 | * | 4/2009 | Dvorak et al. | 327/157 |
| 7,579,902 B2 | * | 8/2009 | Frulio et al. | 327/536 |
| 2005/0127984 A1 | * | 6/2005 | Ohtaka | 327/536 |
| 2005/0189973 A1 | * | 9/2005 | Li | 327/157 |
| 2007/0139099 A1 | * | 6/2007 | Pan | 327/536 |

* cited by examiner

*Primary Examiner*—Cassandra Cox
(74) *Attorney, Agent, or Firm*—SpryIP, LLC

(57) ABSTRACT

One embodiment described is a charge pump arrangement that includes a regulator to regulate signals associated with two output nodes. A switching mechanism may be coupled to the regulator. The switching mechanism is to interrupt the regulator.

22 Claims, 5 Drawing Sheets

DISTURBANCE SUPPRESSION CAPABLE CHARGE PUMP

BACKGROUND

Phase-lock-loops (PLL) may utilize a phase detector for comparing the phase of a reference clock with that of an output clock that utilizes a voltage controlled oscillator (VCO) to generate a phase error that varies a control voltage on the input to the VCO. By adjusting this control voltage, the phase of the VCO can be locked to the phase of the reference clock. Typically, some type of loop filter is disposed between the phase detector and the VCO. Generally, the loop filter is used to perform the function of blocking off undesirable frequency from the incoming signals.

In a PLL system, a typical phase detector generates control voltages for controlling a charge pump circuit which is operable to selectively pump charge (UP current) to a node for increasing a voltage level or pulling charge (DOWN current) from the node to provide a decreasing voltage level. To increase the voltage level, charge is sourced from a supply and, to decrease the voltage level, charge is sinked to a ground reference. When the relative phase between the VCO and the reference clock are either lagging or leading, then either the sourcing or sinking of a charge pump is controlled.

Charge pumps may include two current sources that are switched to the voltage input of the VCO. When charge is being sourced to the node, the phase of the VCO will change from either a lagging or leading phase to a leading or lagging phase, such that the phase detector will then cause the charge pump to sink current. When the PLL is locked, the phase error should be substantially at a zero phase error, which should result in no current being sourced to or sinked from the voltage control input of the VCO.

A prior art charge pump 100 is illustrated in FIG. 1. The charge pump 100 includes a loop filter 102 that is constructed as an RC network. Specifically, the loop filter 102 includes a resistor 104 and a capacitor 106 in series, where the capacitor 106 has a terminal coupled to a reference potential. The resistor 104 and the capacitor 106 define the zero of the loop filter 102. The loop filter 102 further includes a capacitor 108 coupled in parallel with the resistor 104 and the capacitor 106. The loop filter 102 is coupled to a first output node 110 of the charge pump 100. The loop filter 102 is primarily implemented to suppress spikes, ringing and other noise that may influence a regulator 112 (discussed in the next paragraph) when the charge pump 100 handles input control voltages.

As indicated, the prior art charge pump 100 also includes the regulator 112, which is used to regulate a second output node 114 of the charge pump 100 to the same voltage at a node 116 of the loop filter 102. This is achieved by controlling a current source 120. A capacitor 118 is coupled to the second output node 114 and the regulator 112. Assuming appropriate component value selection, the capacitor 118 coupled with the capacitor 106 ensure the first output node 110 and the second output node 114 are in static balance with respect to one another.

Different types of transistors used by the charge pump 100 may cause asymmetric current (UP current and DOWN current) to be supplied to the loop filter 102. If this occurs, the same asymmetric current would also be supplied to the capacitor 118. This causes the regulator 112 compensate for this asymmetric behavior. Disturbances fed into the regulator 112 may disrupt the symmetry between the UP and DOWN current sources.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Exemplary implementations of a charge pump are described herein. One such charge pump employs a switching mechanism that isolates a regulator device while the charge pump is receiving UP or DOWN signals. Use of the switching mechanism substantially eliminates regulator activity during asymmetric current events. The charge pumps described herein may be implemented as part of a phase-lock-loop (PLL) arrangement.

Exemplary Arrangements

Figure 1:
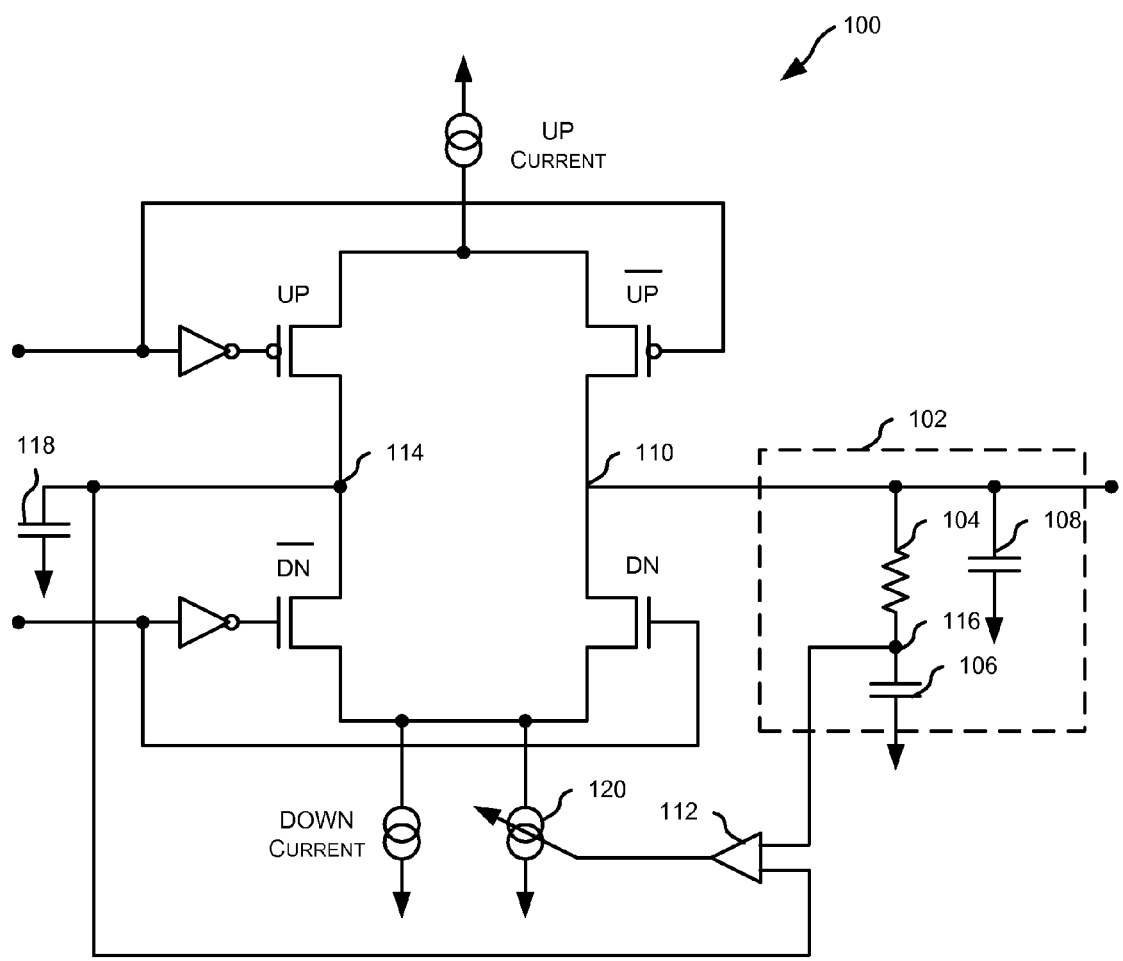
FIG. 1 illustrates a prior art charge pump circuit that may be employed in a phase-lock-loop (PLL) system that incorporates a phase detector that supplies control signals to a charge pump.
Figure 2:
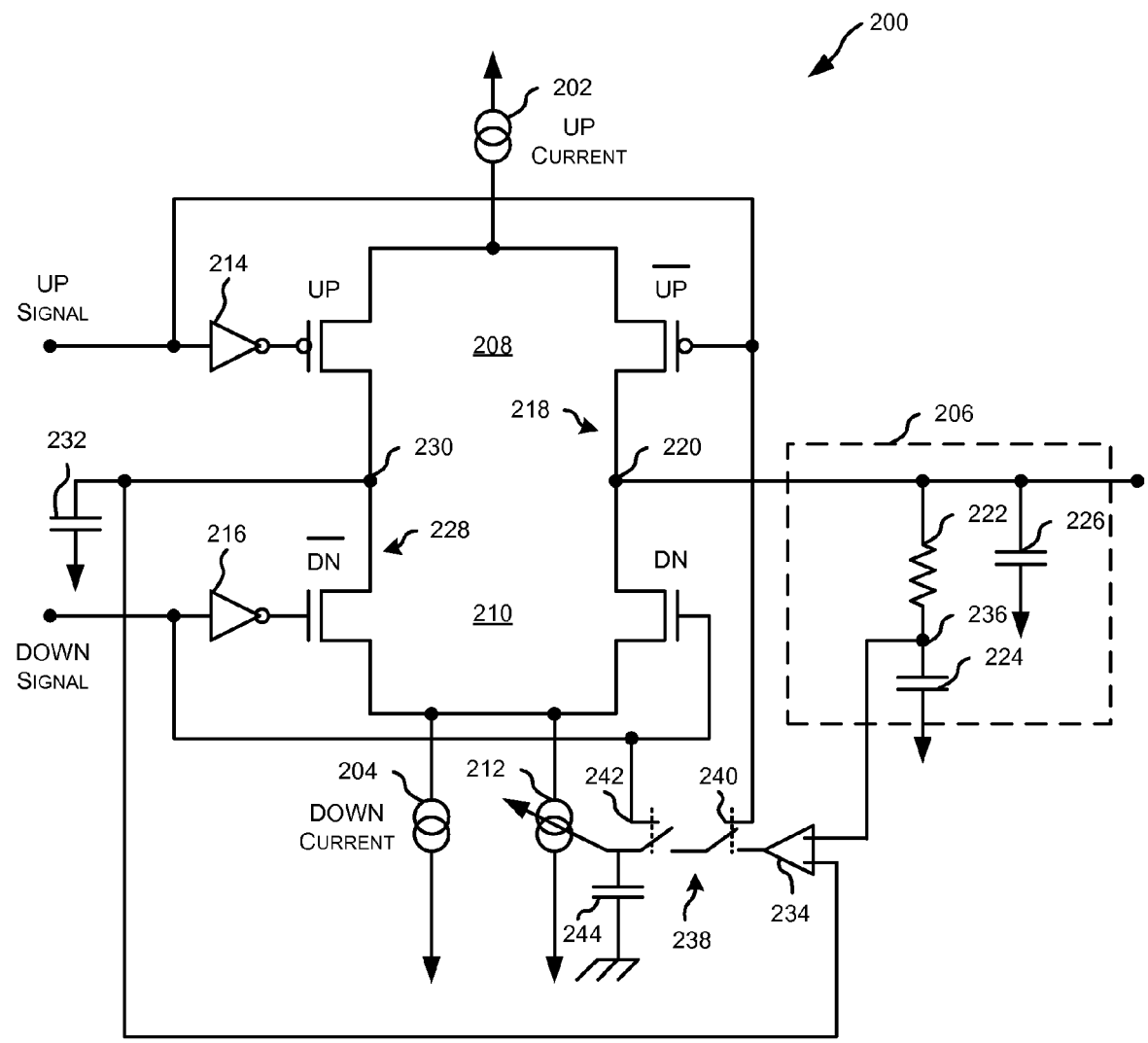
FIG. 2 illustrates a charge pump circuit according to a present implementation and that may be employed in a phase-lock-loop (PLL) system that incorporates a phase detector that supplies control signals to the charge pump circuit.

FIG. 2 illustrates a charge pump circuit 200 according to a present implementation and that may be employed in a PLL system that incorporates a phase detector that supplies control signals to the charge pump circuit 200. The charge pump circuit 200 has two control signal inputs that receive UP and DOWN signals from a control device (not illustrated). The control device may be a phase detector, a frequency mixer, analog multiplexer, or other similar device. Two switched current sources 202 and 204 are part of the charge pump circuit 200. The current sources 202 and 204, when active, supply positive and negative current (e.g., UP current and DOWN current), respectively, to a filter 206. The filter 206 may be a passive filter or an active filter. A loop filter is generally described herein, but such is not limiting of the described implementations.

The charge pump 200 also includes two switching sections 208 and 210. The switching section 208 includes two P-channel transistors, where the source terminals thereof are coupled to the current source 202. The drains of the P-channel transistors are coupled to the drains of two N-channel transistors, which are part of the switching section 210. The sources of the N-channel transistors are connected to the current source 204. In addition, the sources of the N-channel transistors are also connected to a regulated current source 212. As those of skill in the art appreciate, the use of N- and P-channel transistors in the configuration shown in FIG. 2 is merely a matter of design choice. Other configurations may be used while still gaining the benefits of the implementations described herein.

The gate terminals of the P-channel transistors are coupled to the input that receives the UP signal, where the gate terminals of the N-channel transistors are coupled to the input that receives the DOWN signal. One of the P-channel transistors of the switching section 208 has an inverter 214 interposed between the gate of the P-channel transistor and the input that receives the UP signal. Similarly, one of the N-channel transistors of the switching section 210 has an inverter 216 interposed between the gate of the N-channel transistor and the input that receives the DOWN signal. The use of the inverters 214 and 216 in the manner illustrated in FIG. 2 is a matter of design choice, and other implementations that may or may not make use of such inverters are also possible. For example, complementary signals may also be created using differential/symmetrical latch circuitry. In general, any arrangement that supplies complementary/switching signals may be used in connection with the charge pump 200.

One current path 218, defined by a drain of one of the P-channel transistors and a drain of one of the N-channel transistors, has a first output node 220. The first output node 220 supplies source (UP) and sink (DOWN) current to the loop filter 206.

The loop filter 206 includes a resistor device 222 in series with a capacitor 224. The capacitor 224 defines the zero of the loop filter 206. An additional capacitor 226 is included and defines the pole of the loop filter 206.

Another current path 228, defined by a drain of another of the P-channel transistors and a drain of another of the N-channel transistors, has a second output node 230. The second output node 230 is coupled to a capacitor 232.

The charge pump 200 employs the use of a regulator device 234. The regulator device 234 has a first input coupled to a node 236 defined between the resistor device 222 and the capacitor 224 of the loop filter 206. The regulator device 234 has a second input coupled to the second output node 230 and a terminal of the capacitor 232.

An output of the regulator device 234 is coupled to a switching mechanism 238. The switching mechanism 238 is designed to open the output of the regulator device 234 when the current sources 202 and 204 supply positive and negative current (e.g., UP and DOWN current), respectively, to the loop filter 206. Therefore, the switching mechanism 238 operates to lock/block the regulator device 234 during switching activity that routes UP or DOWN current to the filter 206. Although the switching mechanism 238 is illustrated as being designed to open the output of the regulator device 234, it is also possible to configure the switching mechanism 238 so that it opens an input of the regulator device 234.

In one exemplary implementation, the switching mechanism 238 includes two switches 240 and 242. The first switch 240 is controlled by an UP signal input to the charge pump 200, and the second switch 242 is controlled by a DOWN signal input to the pump 200. More specifically, presence of an $\overline{\text{UP}}$ signal will open the switch 240. Therefore, in response to an $\overline{\text{UP}}$ signal, an UP current is sourced from the first output node 220 to the loop filter 206. However, because the switch 240 is in an open state during the sourcing, the regulator device 234 is blocked from regulating the regulated current source 212. Alternatively, presence of a DOWN signal will open the switch 242. Therefore, in response to a DOWN signal, a DOWN current is sinked from the first output node 220. However, because the switch 242 is in an open state during the sinking, the regulator device 234 is blocked from regulating the regulated current source 212.

The switching mechanism 238 may also include a capacitor 244. The capacitor 244 is used keep the regulated current source 212 constant when one or both of the switches 240 and 242 is in an open state.

Further description of the operational characteristics of the charge pump 200 is now provided. During steady state, that is when neither an UP signal nor a DOWN signal is being input to the charge pump 200, any current associated with the second current path 228 is dumped into the capacitor 232 via the second output node 230. During this state, when neither an UP signal nor a DOWN signal is being input, the regulator 234 attempts to equalize the voltage levels at the second output node 230 and the node 236. The regulator 234 seeks to achieve this voltage equalization using the regulated current source 212. Note, influencing the regulated current source 212 is possible, as the switching mechanism 238 is in a closed state when neither an UP signal nor a DOWN signal is being input to the charge pump 200.

When an UP (e.g., an $\overline{\text{UP}}$ signal) or DOWN signal is input to the charge pump 200, the switching mechanism 238 opens, which prevents the regulator device 234 from regulating the voltage levels at the second output node 230 and the node 236 or the first output node 220. This is a desirable result. In particular, isolating or preventing the regulator device 234 from influencing the regulated current source 212 when one of an UP or DOWN signal is applied to the charge pump 200 eliminates regulation of the second current path 228 during a sourcing or sinking mode.

More specifically, when an UP current is supplied to the loop filter 206, only the DOWN current is present in the second current path 228. If the switching mechanism 238 were not present, as in prior art implementations, the regulator device 234 would attempt to regulate the current in the second current path 228. During an UP signal, the UP current in the second current path 228 is at or near zero. This is because substantially all of the UP current is being sourced through the first current path 218. However, any DOWN current still remains in the second current path 228, and this is normal and should not trigger regulation from the regulator device 234. Such undesirable regulation would occur in prior art charge pumps, where the charge pump 200 including the switching mechanism 238 prevents such regulation.

Conversely, when a DOWN current is supplied to the loop filter 206, only the UP current is present in the second current path 228. If the switching mechanism 238 were not present, as in prior art implementations, the regulator device 234 would attempt to regulate the current in the second current path 228. During a DOWN signal, the DOWN current in the second current path 228 is at or near zero. This is because substantially all of the DOWN current is being sinked through the first current path 218. However, any UP current still remains in the second current path 228, and this is normal and should not trigger regulation from the regulator device 234. Such undesirable regulation would occur in prior art charge pumps, where the charge pump 200 including the switching mechanism 238 prevents such regulation.

Although the implementations described hereinabove show the charge pump 200 incorporating the switching mechanism 238, it should be understood that this is byway of example only. In particular, it may be advantageous to implement the charge pump 200 with other technologies that interrupt the regulator 234 when UP and DOWN current is supplied to the loop filter 206. Furthermore, it may be beneficial to operate the switching mechanism 238 with a signal or signals other than the UP signal received by the charge pump 200.

Figure 3:
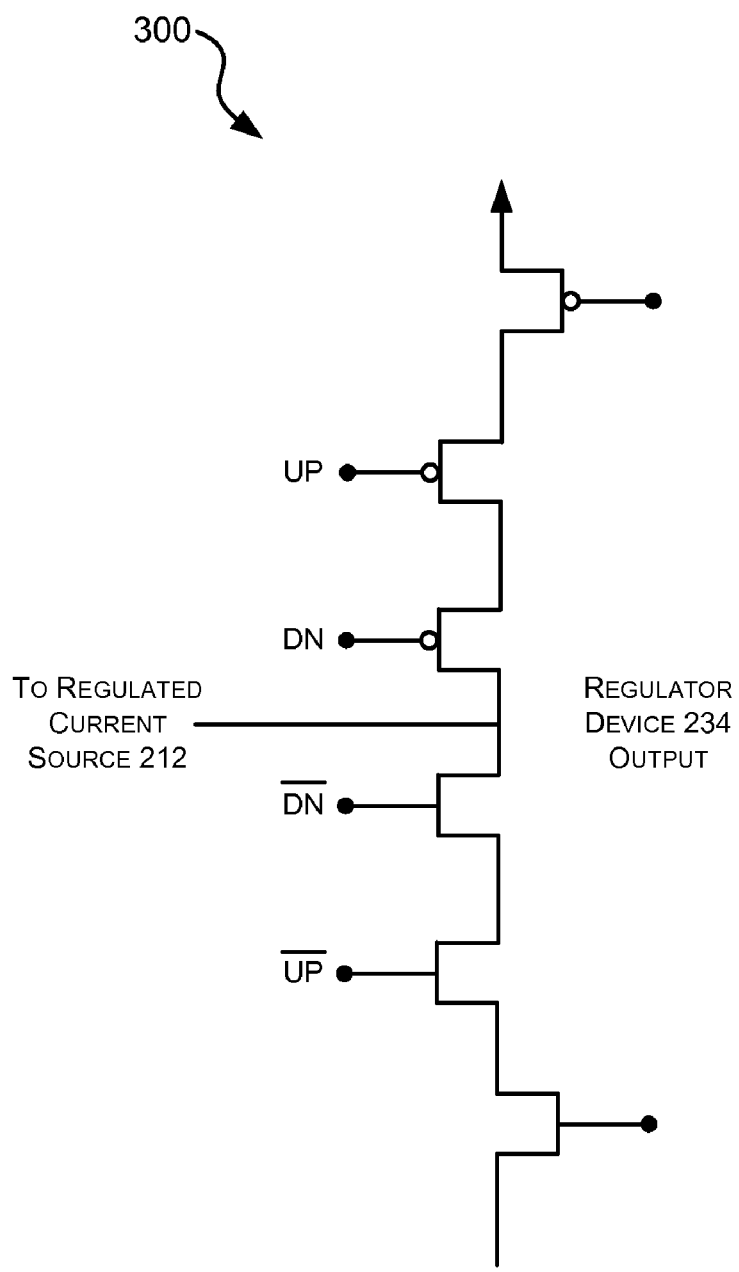
FIG. 3 illustrates an exemplary implementation of the switching mechanism implemented in the charge pump shown in FIG. 2.

FIG. 3 illustrates an exemplary switching mechanism 300 that may be used in place of the switching mechanism 238 implemented in the charge pump 200 shown in FIG. 2. The switching mechanism 300 is in tri-state (i.e., at high impedance) when an UP signal is received, when a DOWN signal is received, and if both an UP and DOWN signal are received. The switching mechanism 300 is in a low impedance state when neither an UP signal nor a DOWN signal is received by the switching mechanism 300.

Figure 4:
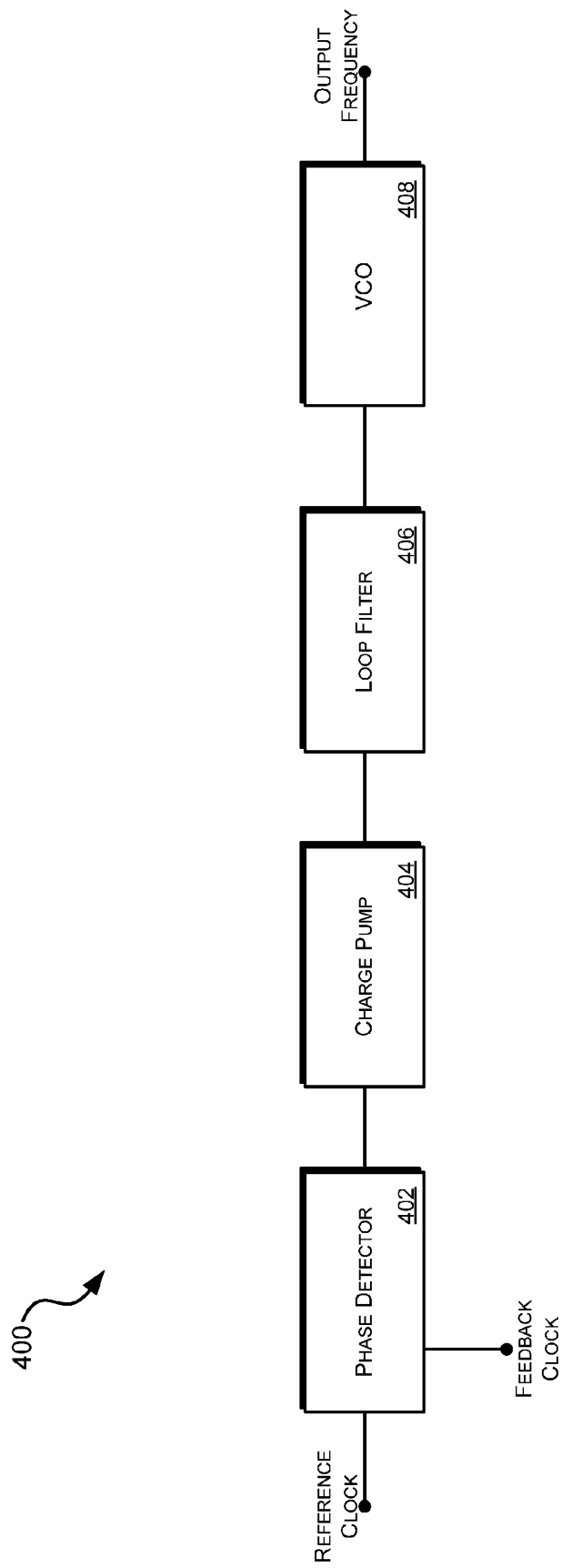
FIG. 4 illustrates a phase-lock-loop (PLL) implementation that may employ the charge pump shown in FIG. 2.

FIG. 4 illustrates a phase-lock-loop (PLL) 400 implementation that may employ the charge pump 200 shown in FIG. 2. A reference clock may be supplied to a phase detector 402. The phase detector 402 also receives a feedback clock from voltage controlled oscillator (VCO) 408. The phase detector 402 detects a difference between the reference clock and the feedback clock, and a charge pump 404, coupled to a loop filter 406, generates a charge corresponding to the difference to drive the VCO 408. Therefore, the VCO 408 output is adjusted up and down to remain "locked" to the reference clock.

Exemplary Environment

Figure 5:
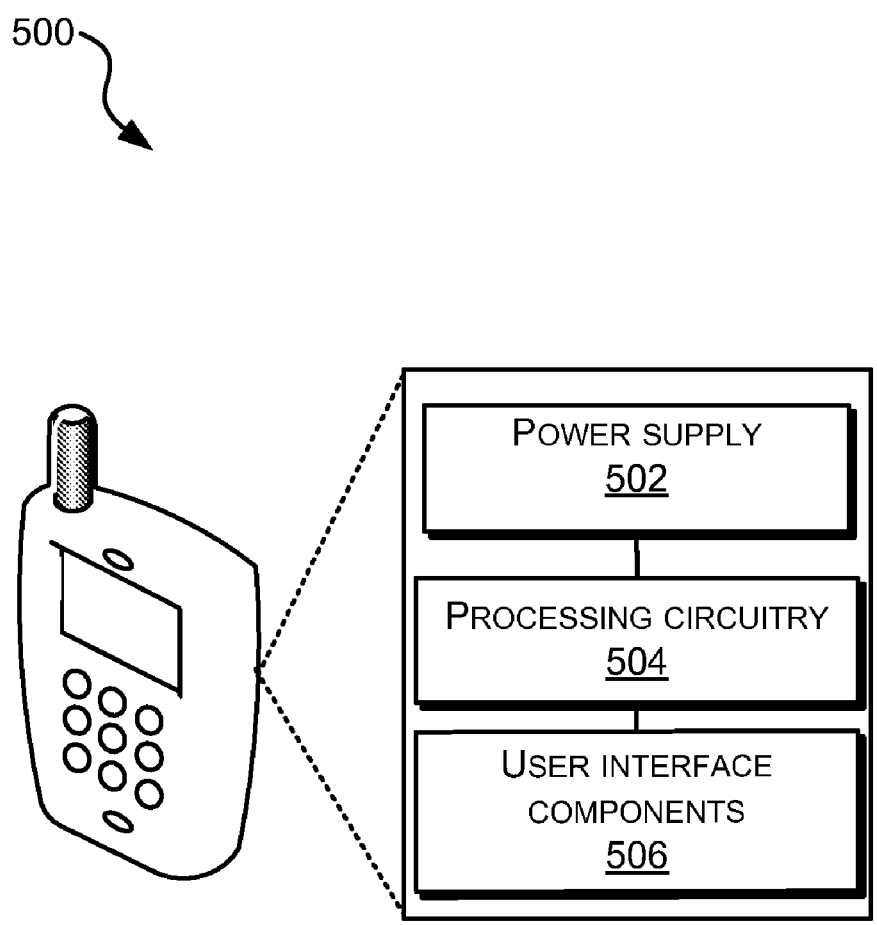
FIG. 5 shows an exemplary environment in which a charge pump may be utilized.

FIG. 5 shows a simplified exemplary implementation of a device 500 that may incorporate a PLL and an associated charge pump. The device 500 may be a portable device, such as a cell phone, having components including a power supply 502, processing circuitry 504 and user interface components 506. The processing circuitry 504 may include an integrated circuit chip and/or other components used to enable operation of the device 500. The user interface components 506 may include a display, keypad, and so forth. Any of the described elements 502, 504 and 506 may implement a PLL and charge pump of the types described herein. Additionally, other components of the device 500, which are not described herein for reasons related to at least brevity, may also implement such PLLs and charge pumps. For the purposes of at least simplicity, further details of the power supply 502, the processing circuitry 504 and the user interface components 506 are not shown or described.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A charge pump arrangement, comprising:
   at least one input node;
   two output nodes;
   a regulator to regulate signals associated with the two output nodes; and
   a switching mechanism coupled to the regulator, the switching mechanism to interrupt the regulator, the switching mechanism to interrupt the regulator when a signal is received by the at least one input node.

2. The charge pump arrangement according to claim 1, wherein the signal causes the switching mechanism to open, the open switching mechanism interrupting the regulator.

3. The charge pump arrangement according to claim 1, wherein a signal input on the at least one input node switches the switching mechanism to an open state.

4. The charge pump arrangement according to claim 1, wherein the switching mechanism includes two switches in a series arrangement.

5. The charge pump arrangement according to claim 1, wherein the at least one input node includes a first input node and a second input node, the first and second input nodes coupled to the switching mechanism.

6. The charge pump arrangement according to claim 5, wherein the switching mechanism includes two switches, a first of the two switches coupled to the first input node and a second of the two switches coupled to the second input node.

7. The charge pump arrangement according to claim 1, wherein the regulator has a first input and a second input, the first input coupled to a first output node of the two output nodes and the second input coupled to a second output node of the two output nodes.

8. The charge pump arrangement according to claim 1, further comprising a first current source and a second current source, the first current source to produce source current and the second current source to produce sink current.

9. The charge pump arrangement according to claim 1, further comprising a filter coupled to one of the two output nodes, the filter including a resistive device coupled to a capacitor, wherein an input of the regulator is coupled to node between the resistive device and the capacitor.

10. The charge pump arrangement according to claim 1, wherein the switching mechanism is coupled to an output of the regulator.

11. The charge pump arrangement according to claim 1, wherein the switching mechanism is coupled to an input of the regulator.

12. An apparatus, comprising:
    a phase-lock-loop (PLL); and
    a charge pump coupled to the PLL, the charge pump comprising:
       at least one input node;
       two output nodes;
       a regulator to regulate signals associated with the two output nodes; and
       a switching mechanism coupled to the regulator, the switching mechanism to interrupt the regulator, the switching mechanism to interrupt the regulator when a signal is received by the at least one input node.

13. The charge pump arrangement according to claim 12, wherein the signal causes the switching mechanism to open, the open switching mechanism interrupting the regulator.

14. The charge pump arrangement according to claim 12, wherein a signal input on the at least one input node switches the switching mechanism to an open state.

15. The charge pump arrangement according to claim 12, wherein the switching mechanism includes two switches in a series arrangement.

16. The charge pump arrangement according to claim 12, wherein the at least one input nodes includes a first input node and a second input node, the first and second input nodes coupled to the switching mechanism.

17. The charge pump arrangement according to claim 16, wherein the switching mechanism includes two switches, a first of the two switches coupled to the first input node and a second of the two switches coupled to the second input node.

18. The charge pump arrangement according to claim 12, wherein the regulator has a first input and a second input, the first input coupled to a first output node of the two output nodes and the second input coupled to a second output node of the two output nodes.

19. The charge pump arrangement according to claim 12, further comprising a first current source and a second current source, the first current source to produce source current and the second current source to produce sink current.

20. The charge pump arrangement according to claim 12, further comprising a filter coupled to one of the two output nodes, the filter including a resistive device coupled to a capacitor, wherein an input of the regulator is coupled to node between the resistive device and the capacitor.

21. The charge pump arrangement according to claim 12, wherein the switching mechanism is coupled to an output of the regulator.

22. The charge pump arrangement according to claim 12, wherein the switching mechanism is coupled to an input of the regulator.

* * * * *